United States Patent
Iga et al.

(10) Patent No.: US 6,692,837 B2
(45) Date of Patent: Feb. 17, 2004

(54) SEMI-INSULATING SUBSTRATE, SEMICONDUCTOR OPTICAL DEVICE AND FABRICATION METHOD OF SEMICONDUCTOR THIN FILM

(75) Inventors: Ryuzo Iga, Atsugi (JP); Matsuyuki Ogasawara, Isehara (JP); Susumu Kondo, Tama (JP); Yasuhiro Kondo, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/143,121

(22) Filed: May 10, 2002

(65) Prior Publication Data

US 2002/0168856 A1 Nov. 14, 2002

(30) Foreign Application Priority Data

May 11, 2001 (JP) ........................ 2001-141183

(51) Int. Cl.⁷ ........................... B23B 9/04; B23B 15/04; C30B 23/02
(52) U.S. Cl. ................... 428/469; 428/697; 428/704; 117/2; 117/953; 117/954; 438/480; 438/510
(58) Field of Search ................. 428/689, 697, 428/704, 457, 469; 117/2, 953, 954; 438/510, 480

(56) References Cited

U.S. PATENT DOCUMENTS

2001/0030327 A1 * 10/2001 Furushima .................. 257/102

FOREIGN PATENT DOCUMENTS

| DE | 197 47 996 C1 | 10/1997 |
| JP | 3-263388 | 11/1991 |
| JP | 7-135369 | 5/1995 |
| JP | 9-133902 | 5/1997 |
| JP | 11-024020 | 1/1999 |
| JP | 2000-332287 | 11/2000 |
| WO | WO 99/21216 * | 4/1999 |

OTHER PUBLICATIONS

S. Kondo, Y. Noguchi, K. Tsuzuki, M. Yuda, S. Oku, Y. Kondo, "Ru–doped Semi–Insulating Inp buried InGaAlAs/InAlAs MQWs modulators", 2001 Autumn JSAP annual meeting, 14a–Y–7, Sep. 2001, 1 page and English translation.

A. Dadgar et al., "Ruthenium: A superior compensator of InP" Applied Physics Letters, vol. 73, No. 26, Dec. 1998, pp.3878–3880.

A. Dadgar et al., "Growth of Ru doped semi–insulating InP by low pressure metalorganic chemical vapor deposition", Journal of Crystal Growth 195 (1998), pp. 69–73, no month.

A. van Geelen et al., Ruthenium Doped High Power 1.48 $\mu m$ Sipbh Laser, 11$^{th}$ International Conference on Indium Phosphide and Related Materials, May 1999, pp. 203–206.

Y. Akage et al., "Wide bandwith of over 50 GHz traveling–wave electrode electroabsorption modulator integrated DFB lasers", Electronics Letters, vol. 37, No. 5, Mar. 2001, pp.299–300.

(List continued on next page.)

*Primary Examiner*—Stephen Stein
(74) *Attorney, Agent, or Firm*—Kenyon & Kenyon (57) ABSTRACT

A semi-insulating InP substrate in which a Ru-doped semi-insulating semiconductor layer is formed on the surface is provided, wherein the Ru-doped semi-insulating semiconductor layer has a complete semi-insulating property. The semiconductor optical device is fabricated by forming the Ru-doped semi-insulating semiconductor layer on a Fe-doped semi-insulating InP substrate, and forming a semiconductor crystal layer to which a p-type impurity is doped.

5 Claims, 4 Drawing Sheets

OTHER PUBLICATIONS

Y. Sakai et al., "1.55 µm InGaAsP/InP laser buried in a high–resistivity epitaxial layer on a semi–insulating InP substrate", Electronics Letters, vol. 30, No. 18, Sep. 1994, pp. 1481–1482.

Susumu Kondo et al., Ruthenium–doped semi–insulating InP buried InGaAlAs/InAlAs MQWs modulators, 13$^{th}$ IPRM, May 2001, pp. 19–20.

D. Soderstrom et la., "Electrical Characterization of Ruthenium–Doped InP Grown by Low Pressure Hydride Vapor Phase Epitaxy", Electrochemical and Solid–state Letters, 4(6), pp. G53–G55 (2001), no month.

D. Soderstrom et al., "Dopant Diffusion and Current Voltage Studies on Epitaxial InP Codoped with Ru and Fe", Journal of Electronic Meterials, vol. 30, No. 8, pp. 972–976 (2001), no month.

D. Soderstrom et al., "Studies on Ruthenium–Doped InP Growth by Low–Pressure Hydride Vapor–Phase Epitaxy", Journal of Electronic Materials, 148(7), pp. G375–G378 (2001), no mth.

* cited by examiner

SEMI-INSULATING SUBSTRATE, SEMICONDUCTOR OPTICAL DEVICE AND FABRICATION METHOD OF SEMICONDUCTOR THIN FILM

BACKGROUND OF THE INVENTION

1. Field of the Invention

The present invention relates to a semi-insulating InP substrate, a fabrication method of semiconductor thin film, and a semiconductor optical device fabricated by using the method.

2. Description of the Related Art

A semiconductor device fabricated on a semi-insulating substrate such as a semiconductor laser, a semiconductor optical modulator, a monolithically integrated laser and modulator can perform high speed modulation since device capacitance of such a semiconductor device is smaller than that of a semiconductor device fabricated on an n-type substrate or a p-type substrate. Therefore, the semiconductor optical device fabricated on the semi-insulating semiconductor substrate is indispensable for realizing a high capacity optical transmission system.

Generally, these semiconductor devices have a structure in which an about 2 μm-width mesa stripe is buried with a semi-insulating semiconductor or stacked layers including a pn-junction. The mesa stripe is formed by stacking an n-type semiconductor crystal layer, a nondoped semiconductor crystal layer and a p-type semiconductor crystal layer in this order (refer to Japanese laid open patent application No. 11-24020, for example).

However, when adopting this layer structure, device resistance can not be decreased, because a p-electrode with larger contact resistance than that of an n-electrode must be used as a top electrode. Since an area of a top electrode with a narrow stripe pattern is smaller than that of a bottom electrode, a resistance of the device with a p-type top electrode is larger than that of the device with a p-type bottom electrode. Therefore, good device performance can not be obtained.

The reason for forming the n-type semiconductor layer adjacent to the semi-insulating substrate is to avoid inter-diffusion between Zn and Fe which is widely used as a semi-insulating impurity for InP. More specifically, the reason is that, if a Zn-doped semiconductor crystal layer is grown on a Fe-doped semi-insulating substrate, inter-diffusion between Fe and Zn occurs so that concentration of p-type dopant decreases and the semi-insulating property of the substrate degrades. The p-type impurity that causes inter-diffusion between the p-type impurity and Fe is not limited to only Zn. Other p-type impurities such as Be, Cd, and Mg cause similar inter-diffusion.

To solve this problem, Japanese laid open patent application No. 2000-332287 discloses a technology in which a buffer layer is inserted between the semi-insulating substrate and the Zn-doped semiconductor layer for preventing the inter-diffusion. As examples of the buffer layer, a low concentration p-type layer and a low concentration semi-insulating doping layer are disclosed. That is, inter-diffusion is prevented by lowering the concentration of the p-type impurity or the semi-insulating impurity.

However, this structure includes the following problems. As shown in FIGS. 2 and 4, and the corresponding descriptions in the Japanese laid open patent application No. 2000-332287, when a low concentration p-type layer is used for preventing inter-diffusion, the p-type dopant concentration must be adjusted to about $1 \times 10^{15}$ cm$^{-3}$. When a low concentration semi-insulating doping layer is used, the dopant concentration must be adjusted to about $5 \times 10^{15}$ cm$^{-3}$.

If the dopant concentration increases to about $1 \times 10^{16}$ cm$^{-3}$, the amount of diffusion of the dopant increases to the extent that device performance degrades. However, since it is difficult to control doping concentration accurately at a low concentration region, it is difficult to fabricate high performance devices by high yield with good reproducibility. More specifically, when inserting the low concentration p-type layer as the buffer layer, depletion in the low concentration p-type layer occurs, and the conductivity of a part of the semi-insulating substrate becomes a p-type due to diffusion of the p-type dopant. As a result, parasitic capacitance increases, and, since a low-resistive layer is formed in the substrate, leakage currents increase, and, there is a problem in that complete electrical isolation of the devices are not obtained. In addition, when diffused p-type dopant reaches the active region of the device, performance of the device directly degrades. In the same way, when the low concentration semi-insulating doping layer is inserted as the buffer layer, the conductivity of a part of the semi-insulating substrate becomes p-type, and performance of the device degrades due to diffusion of the p-type dopant. As a result, there occurs a problem in that parasitic capacitance increases, and complete electrical isolation of the devices are not obtained.

As for the low concentration semi-insulating doping layer, the Japanese laid open patent application 2000-332287 discloses that a layer to which Ru is doped at a low concentration is used as the buffer layer for preventing inter-diffusion of dopants between the semi-insulating substrate and the p-type semiconductor layer. However, the doping concentration for the semi-insulating layer is equal to or below $1 \times 10^{16}$ cm$^{-3}$ according to the Japanese laid open patent application 2000-332287. As is described in A. Dadger et al., Applied Physics Letters 73, No 26 pp 3878–3880 (1998), for example, it is known that the ratio of electronically activated Ru atoms that compensate for electrons to the doped Ru atoms in the semiconductor layer is about 6%. Therefore, when the doping concentration of Ru in the semiconductor layer is $1 \times 10^{16}$ cm$^{-3}$, the concentration of the activated Ru atoms that compensate for electrons is about $6 \times 10^{14}$ cm$^{-3}$. However, since the concentration of electrons in a nondoped InP layer is usually from $1 \times 10^{15}$ cm$^{-3}$ to $1 \times 10^{16}$ cm$^{-3}$, it is difficult to obtain the semi-insulating InP layer by using the Ru doping concentration of $1 \times 10^{16}$ cm$^{-3}$. Therefore, the semiconductor layer with low Ru concentration of $1 \times 10^{16}$ cm$^{-3}$ or less does not have a complete semi-insulating property, so that the conductivity of the low Ru concentration semiconductor layer may become n-type, which may cause an increase of parasitic capacitance and leakage currents, and degradation of device performance.

Recently, it has been found that a Ru-doped InP layer is semi-insulating, and that, inter-diffusion between Zn and Ru does not occur when a Ru-doped semi-insulating InP crystal layer is grown on a Zn-doped semiconductor crystal layer by using the MOVPE (Metalorganic Vapor Phase Epitaxy) method (A. Dadger et al., Applied Physics Letters 73, No 26 pp 3878–3880 (1998)).

Generally, Fe, as a semi-insulating dopant, is used for fabricating a semi-insulating InP substrate. The semi-insulating InP substrate is obtained by growing an ingot 2 inches in diameter using the LEC (Liquid Encapsulated Czochralski) method, and by slicing the ingot.

However, a Ru-doped semi-insulating substrate has not been obtained. In addition, a semi-insulating substrate on which a Ru-doped semiconductor layer that has a complete semi-insulating property is formed has not be obtained.

The semiconductor layer that has a complete semi-insulating property is defined to be a semiconductor layer in which an electron compensator is doped at a concentration higher than the concentration of electrons in the semiconductor layer so that the semiconductor layer has a semi-insulating property. In this definition, the electron compensator is the active Ru that acts as the electron compensator.

In addition, it has not been reported that a semiconductor optical device is formed on a Ru-doped semiconductor layer that has a complete semi-insulating property.

SUMMARY OF THE INVENTION

An object of the present invention is to solve a problem caused by forming a p-type semiconductor layer on the Fe-doped semi-insulating InP substrate.

In the present invention, a semi-insulating InP substrate with a new structure, a method for forming a p-type semiconductor layer on the semi-insulating substrate, and a semiconductor optical device fabricated by using the method are proposed.

The above-mentioned object can be achieved by a semi-insulating substrate comprising:
  a substrate;
  a Ru-doped semi-insulating semiconductor layer that is formed on the substrate; and
  wherein the Ru-doped semi-insulating semiconductor layer has a complete semi-insulating property.

The semiconductor layer that has a complete semi-insulating property is defined to be a semiconductor layer in which an electron compensator is doped at a concentration higher than the concentration of electrons in the semiconductor layer so that the semiconductor layer has a semi-insulating property. In this definition, the electron compensator is the active Ru that acts as the electron compensator.

In the semi-insulating substrate the substrate may be a Fe-doped semi-insulating InP substrate; and the Ru-doped semi-insulating semiconductor layer may be a Ru-doped semi-insulating InP layer.

In addition, in the semi-insulating substrate, the substrate may be a Fe-doped semi-insulating InP substrate; and the Ru-doped semi-insulating semiconductor layer may be a Ru-doped semi-insulating InAlAs layer, or a Ru-doped semi-insulating InGaAs layer, or a Ru-doped semi-insulating InGaAlAs layer, or a Ru-doped semi-insulating InGaAsP layer.

The above-mentioned object is also achieved by a semiconductor optical device comprising at least a p-type semiconductor layer, a nondoped semiconductor layer and an n-type semiconductor layer, which are stacked in this order on a semi-insulating substrate;
  the semi-insulating substrate comprising:
    a substrate;
    a Ru-doped semi-insulating semiconductor layer that is formed on the substrate; and
    wherein the Ru-doped semi-insulating semiconductor layer has a complete semi-insulating property.

The above-mentioned object is also achieved by a fabrication method of semiconductor thin film, comprising the steps of:
  forming a Ru-doped semi-insulating semiconductor layer on a Fe-doped semi-insulating InP substrate, wherein the Ru-doped semi-insulating semiconductor crystal layer has a complete semi-insulating property; and
  forming a semiconductor crystal growth layer to which a p-type impurity is doped.

That is, in the present invention, a Ru-doped InP layer or a Ru-doped alloy semiconductor crystal layer such as InGaAsP, InGaAs, InGaAlAs and InAlAs which are lattice-matched to InP is formed between a Fe-doped semi-insulating substrate and a p-type impurity doped semiconductor layer in order to prevent inter-diffusion between Fe and p-type impurity.

The Ru doping concentration means a concentration of Ru atoms incorporated into the semiconductor crystal, and this concentration is different from that of active Ru which acts as an electron compensator.

Normally, the activation ratio of Ru is about 6% in a (100) oriented semiconductor crystal.

The present invention is contrived by using a unique characteristic of Ru in that, Ru is an impurity for making the semiconductor crystal, such as InP, semi-insulating, and that, inter-diffusion between Ru and the p-type impurity does not occur even when Ru is doped at a high concentration. Therefore, the Ru-doped semiconductor layer of the present invention is different from the buffer layer disclosed in the Japanese laid open patent application No. 2000-332287. In the present invention, Ru is doped at a high concentration such that the InP layer has a complete semi-insulating property. On the other hand, the semi-insulating impurity is doped at a low concentration in the conventional technology. This is one of the different points between the present invention and the conventional technology. Therefore, according to the present invention, the Ru-doped InP layer has a complete semi-insulating property, and inter-diffusion between Ru and the p-type impurity does not occur, so that a stable, highly resistive layer can be realized. Thus, a high performance device without leakage currents can be obtained.

According to the present invention, the following effects can be obtained.

Since the Ru-doped InP layer is semi-insulating and inter-diffusion between a p-type impurity such as Zn and Ru does not occur, a semi-insulating substrate with a stable highly resistive layer can be realized. In addition, even when a high concentration p-type semiconductor layer is directly formed on the semi-insulating semiconductor substrate, resistivity of the substrate is not lowered and conductivity of the p-type semiconductor layer is not lowered.

In addition, a Ru-doped alloy semiconductor crystal layer such as Ru-doped InGaAsP, Ru-doped InGaAs, Ru-doped InGaAlAs and Ru-doped InAlAs is also semi-insulating, and inter-diffusion between a p-type impurity such as Zn and Ru does not occur if these Ru-doped alloy layers are formed on the semi-insulating substrate. Thus, a stable semi-insulating substrate with a highly resistive layer can be realized. Further, even when a high concentration p-type semiconductor layer is formed directly on the semi-insulating semiconductor substrate, resistivity of the substrate is not lowered and conductivity of the p-type semiconductor layer is not lowered.

Therefore, the substrate in which the Ru-doped layer is formed on the Fe-doped semi-insulating InP substrate can be used as a semi-insulating substrate. In addition, even when a semiconductor layer which includes a p-type dopant such as Zn is formed on the semi-insulating substrate, inter-diffusion between Ru and the p-type dopant does not occur.

Similarly, when the semiconductor layer that includes the p-type dopant such as Zn is formed after the Ru-doped layer is formed on the Fe-doped semi-insulating InP substrate, inter-diffusion between Ru and the p-type dopant does not occur.

Further, as mentioned above, as for a semiconductor optical device formed by stacking at least a p-type semiconductor layer, a nondoped semiconductor layer and an n-type semiconductor layer on the semi-insulating InP substrate with the Ru-doped layer on the substrate, inter-diffusion between Ru and the p-type dopant does not occur. Therefore, since the device can be formed such that the p-electrode with a large area can be placed as a bottom layer, and an n-electrode with a small area can be placed as a top layer, resistivity can be decreased and good performance can be obtained.

BRIEF DESCRIPTION OF THE DRAWINGS

Other objects, features and advantages of the present invention will become more apparent from the following detailed description when read in conjunction with the accompanying drawings, in which:

FIGS. 3A–4B are figures for explaining a method for fabricating a semiconductor optical device according to third and fourth embodiments of the present invention.

DETAILED DESCRIPTION OF THE PREFERRED EMBODIMENTS

In the following, embodiments of the present invention will be descried with reference to figures.

First Embodiment

Figure 1:
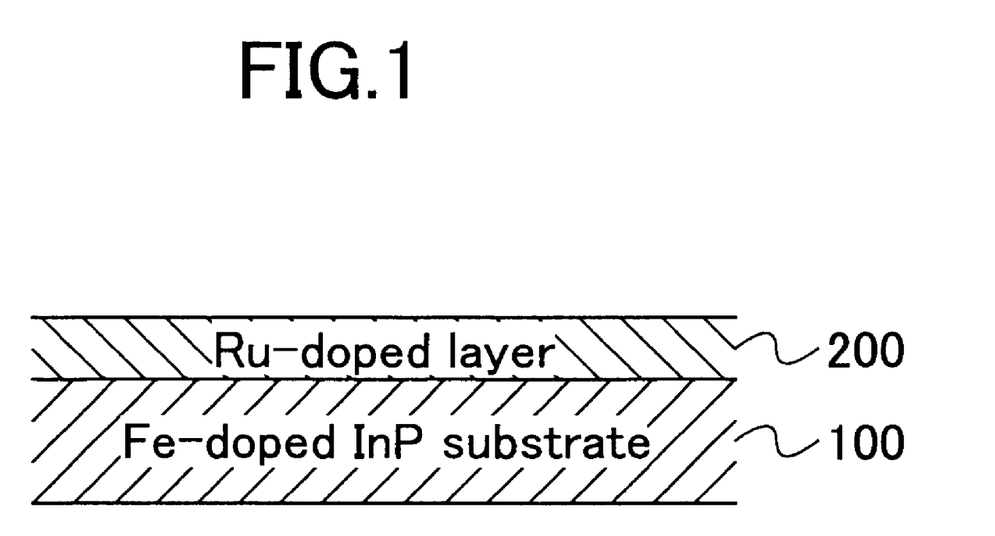
FIG. 1 shows a structure of a semi-insulating InP substrate according to a first embodiment of the present invention.

FIG. 1 shows the first embodiment of the present invention. The first embodiment is a semi-insulating InP substrate in which a Ru-doped semi-insulating semiconductor layer 200 is formed on the surface of a Fe-doped semi-insulating InP substrate 100, in which the concentration of the doped Ru is for obtaining the semiconductor layer 200 with a complete semi-insulating property.

The Ru-doped layer 200 is a Ru-doped InP, or an alloy semiconductor crystal layer such as InGaAsP, InGaAs, InGaAlAs and InAlAs layer which are lattice-matched to InP.

The semi-insulating InP substrate according to this embodiment can be used as a semi-insulating substrate since the Ru-doped semi-insulating layer 200 is formed on the Fe-doped semi-insulating InP substrate 100 which is a conventional substrate. In addition, inter-diffusion between Ru and the P-type dopant does not occur even when a semiconductor layer including p-type dopant such as Zn is formed on the substrate.

That is, since the Ru-doped layer 200 is semi-insulating, and inter-diffusion between Ru and the p-type impurity does not occur, a semi-insulating InP substrate with a stable and highly resistive layer can be realized.

Such Ru-doped layer 200 can be easily formed by the MOVPE method. An 1 μm-thick Ru-doped InP layer or InAlAs layer is grown on a Fe-doped semi-insulating InP substrate 100 by using the MOVPE method. Bis(η$^5$-2,4-dimethylpentadienyl) ruthenium(II) is used as a source material for Ru. In the growth of the Ru-doped InP, the following typical growth conditions are used. That is, hydrogen is used as a carrier gas, pressure in the growth reactor is 5.0 kPa, the growth temperature is 600° C., supplying ratio of the group V precursor to the group III precursor (V/III ratio) is 10–20.

The resistivity of the grown Ru-doped InP is $10^8$–$10^9$ Ωcm, which is a high resistivity the same as that of the Fe-doped semi-insulating InP substrate. The Ru doping concentration in this case is about $1 \times 10^{18}$ cm$^{-3}$. Like this Ru-doped InP, the resistivity of the Ru-doped InAlAs layer is $10^8$–$10^9$ Ωcm. Thus, it can be understood that a highly resistive InAlAs layer is obtained. The Ru doping concentration of the Ru-doped InAlAs layer is also about $1 \times 10^{18}$ cm$^{-3}$.

Second Embodiment

Figure 2:
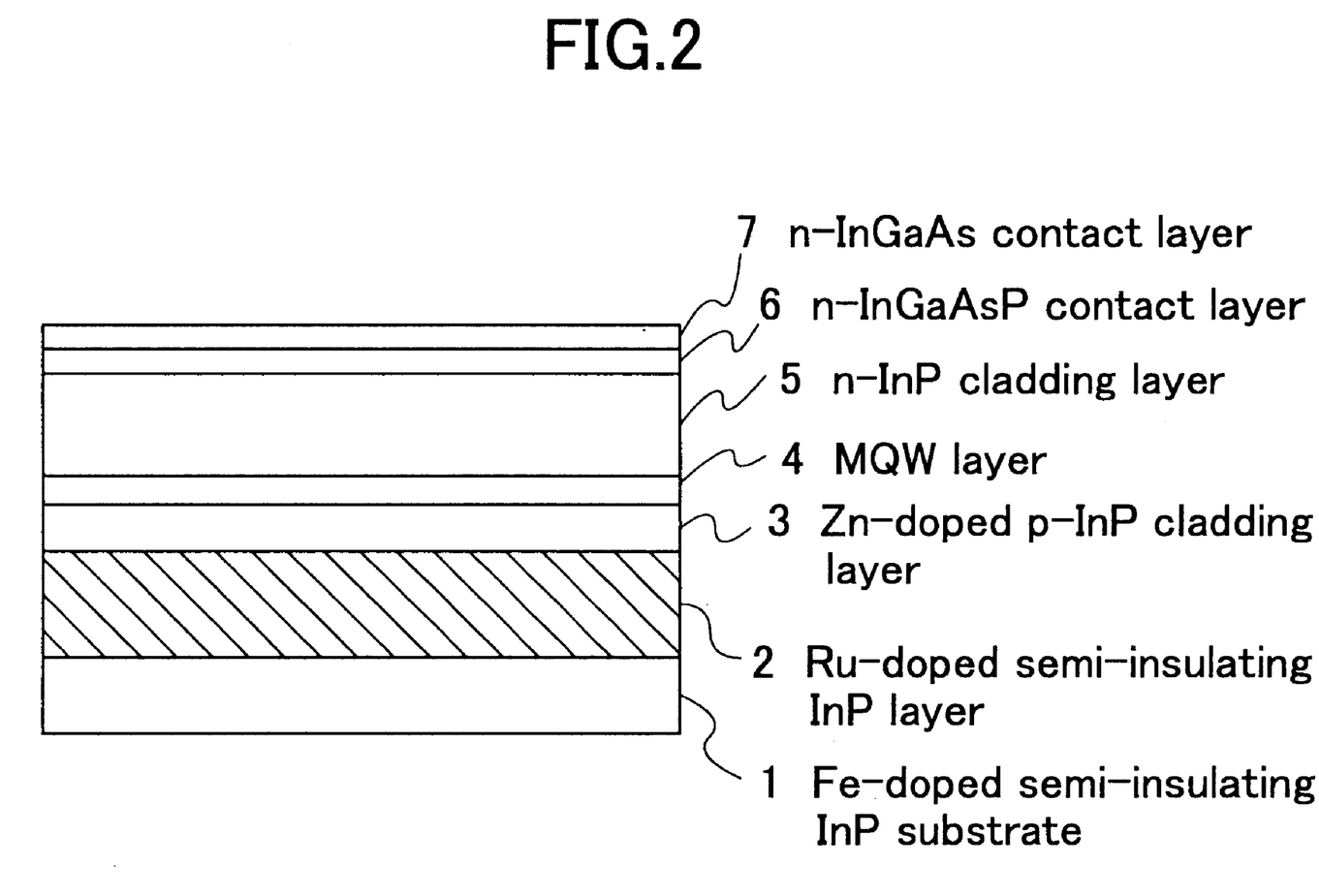
FIG. 2 is a figure for explaining a method for forming semiconductor layers according to a second embodiment of the present invention.

FIG. 2 shows the second embodiment of the present invention. In this embodiment, a semiconductor thin film is formed in the following way.

First, an 1 μm-thick Ru-doped InP layer 2 (Ru doping concentration is about $1 \times 10^{18}$ cm$^{-3}$) is grown on a (100) oriented Fe-doped semi-insulating InP substrate 1 by the MOVPE method. Bis(η$^5$-2,4-dimethylpentadienyl) ruthenium(II) is used as a source material for Ru.

Next, an 1 μm-thick Zn-doped p-InP cladding layer 3, a 0.15 μm-thick nondoped InGaAsP/InGaAsP strained MQW (multiple quantum well) active layer 4 (lasing wavelength 1.55 μm), an 1.5 μm-thick Se-doped n-InP cladding layer 5, a 0.1 μm-thick Se-doped n-InGaAsP contact layer 6 (bandgap wavelength 1.3 μm), and a 0.3 μm-thick Se-doped n-InGaAs contact layer 7 are grown in this order.

Each compound semiconductor layer except for the active layer is lattice-matched to the InP substrate except where specifically noted.

In this embodiment, the Ru-doped semi-insulating InP layer 2 is inserted between the Fe-doped semi-insulating InP substrate 1 and the Zn-doped p-type InP cladding layer 3, in which the concentration of the doped Ru is for obtaining the semiconductor layer 2 with a complete semi-insulating property. Therefore, inter-diffusion between Fe and Zn can be prevented.

As a result, conventional problems are solved. That is, the semi-insulating property of the substrate does not degrade, and the concentration of the p-type dopant in the p-type cladding layer does not decrease.

Third Embodiment

FIGS. 3A–4B show the third embodiment of the present invention. In this embodiment, a semiconductor laser is fabricated on the semi-insulating semiconductor substrate of the first embodiment. The semiconductor optical device in this embodiment is fabricated in the following way.

Figure 3A:
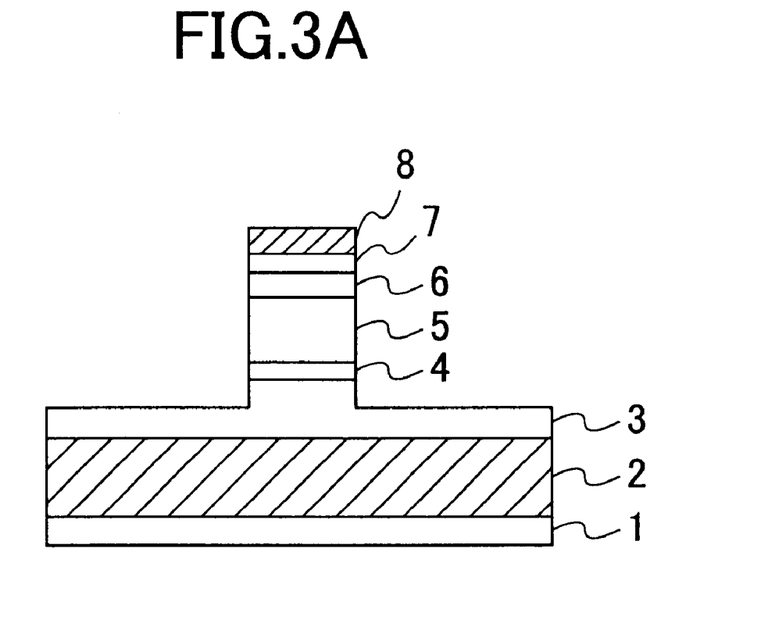

First, as shown in FIG. 3A, an 1 μm-thick Ru-doped InP layer 2 (Ru doping concentration is about $1 \times 10^{18}$ cm$^{-3}$) is grown on a (100) oriented Fe-doped semi-insulating InP substrate 1 by the MOVPE method. Bis(η$^5$-2,4-dimethylpentadienyl) ruthenium(II) is used as a source material for Ru.

Next, an 1 μm-thick Zn-doped p-InP cladding layer 3, a 0.15 μm-thick nondoped InGaAsP/InGaAsP strained MQW (multiple quantum well) active layer 4 (lasing wavelength 1.55 μm), an 1.5 μm-thick Se-doped n-InP cladding layer 5, a 0.1 μm-thick Se-doped n-InGaAsP contact layer 6 (bandgap wavelength 1.3 μm), and a 0.3 μm-thick Se-doped n-InGaAs contact layer 7 are grown in this order.

Each compound semiconductor layer except for the active layer is lattice-matched to the InP substrate except where specifically noted.

Next, as shown in FIG. 3A, the layers which are not covered by a SiO$_2$ mask 8 are etched to about halfway through the Zn-doped n-InP cladding layer 3 by RIE (reactive ion etching), so that a mesa stripe with about 2 μm width and about 2.5 μm height is formed.

Figure 3B:
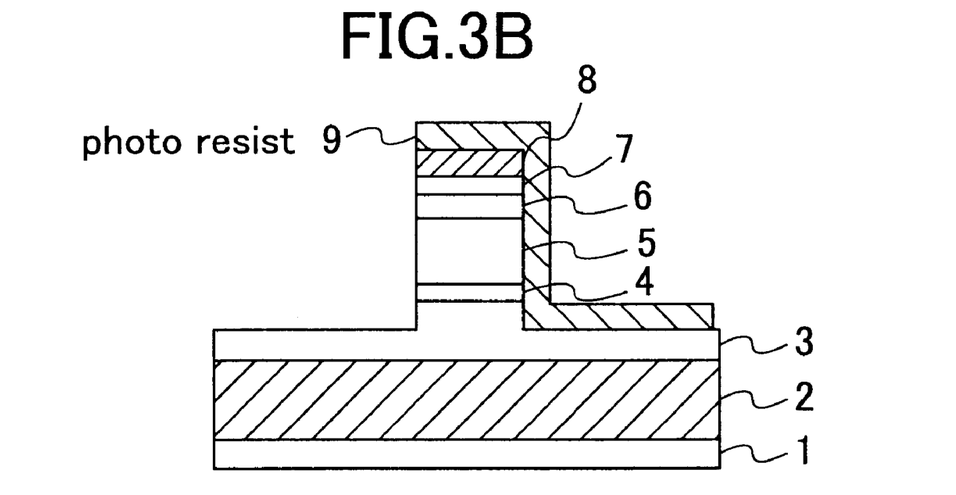

In addition, as shown in FIG. 3B, the SiO$_2$ mask 8 and one side of the mesa stripe are covered with a photo resist 9. Then, the side which is not covered by the photo resist 9 is etched to halfway through the Ru-doped InP layer 2 by RIE.

Figure 4A:
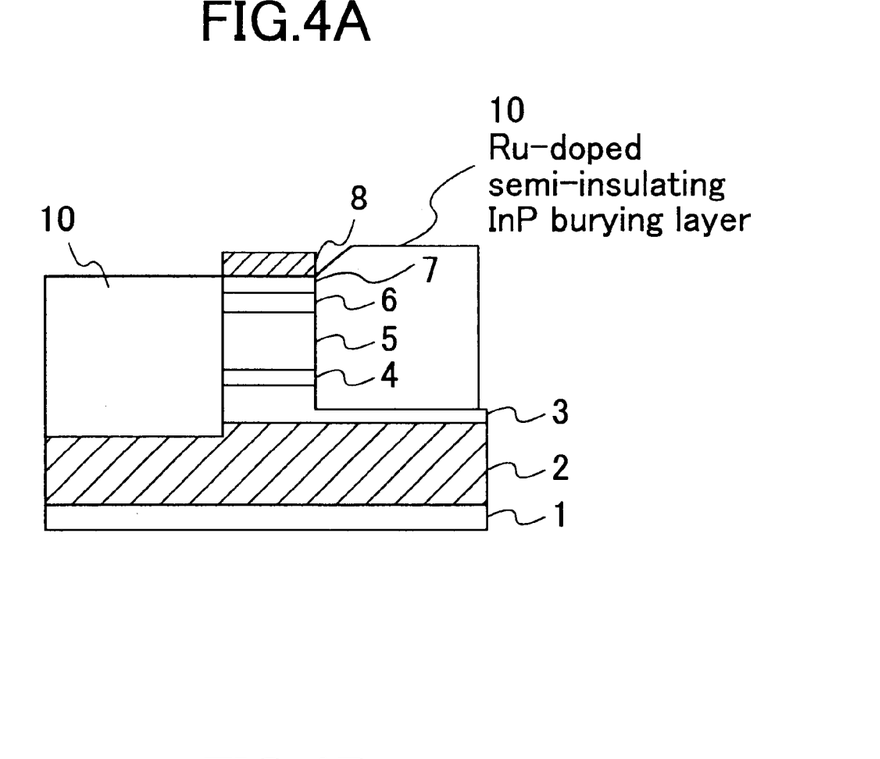

After that, the photo resist 9 is removed, and, as shown in FIG. 4A, a 3 μm-thick semi-insulating InP burying layer 10 is grown (Ru doping concentration is about $2 \times 10^{18}$ cm$^{-3}$) on both sides of the mesa stripe while doping Ru by the MOVPE method.

Figure 4B:
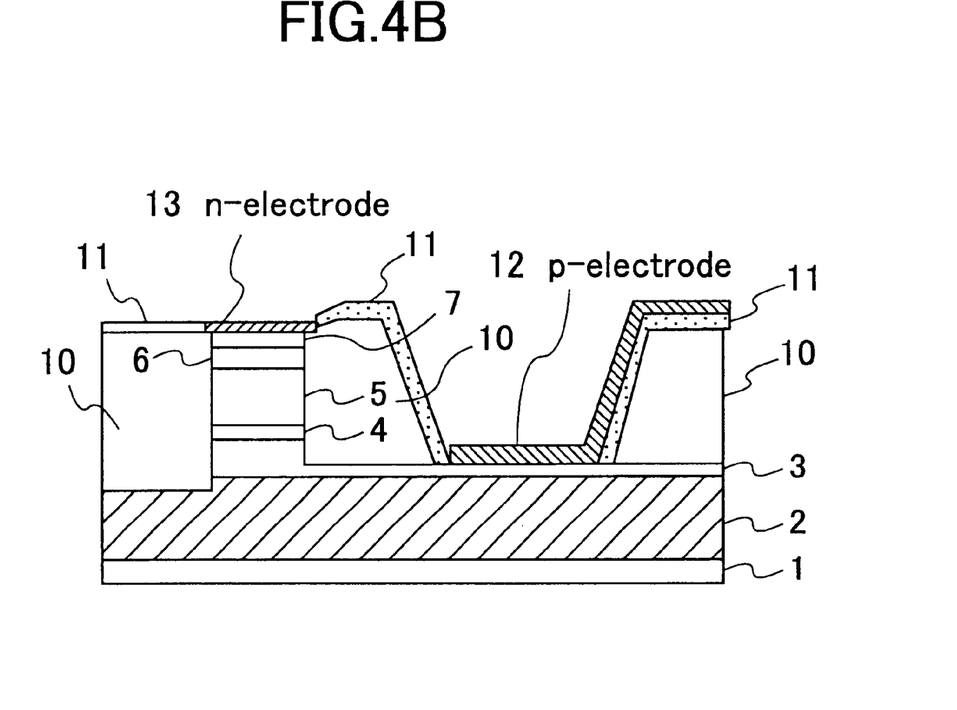

Then, as shown in FIG. 4B, a part of the Ru-doped semi-insulating InP burying layer 10 is removed by RIE, so that the Zn-doped InP cladding layer 3 is exposed, and a p-electrode 12 is formed on the surface. In addition, an n-electrode 13 is formed on the top of the mesa stripe.

In this embodiment, the Ru-doped semi-insulating InP layer 2 is inserted between the Fe-doped semi-insulating InP substrate 1 and the Zn-doped p-InP cladding layer 3, in which the concentration of the doped Ru is for obtaining the InP layer 2 with a complete semi-insulating property. Since Ru is doped in this Ru-doped semi-insulating InP layer 2 at a high concentration, this layer is highly resistive. This is different from the conventional technology By adopting this structure, the Ru-doped semi-insulating InP layer 2 is inserted between the Fe-doped semi-insulating InP substrate 1 and the Zn-doped p-InP cladding layer 3, so that inter-diffusion between Fe and Zn can be prevented, in which the Ru-doped semi-insulating InP layer 2 has a complete semi-insulating property by doping Ru at a high concentration.

As a result, conventional problems are solved. That is, the semi-insulating property of the substrate does not degrade, and the concentration of the p-type dopant in the p-type cladding layer does not decrease.

Performance of the semiconductor laser of this embodiment improves compared with a conventional device in which an n-type semiconductor crystal layer, a nondoped semiconductor crystal layer and a p-type semiconductor crystal layer are formed in this order. The differential resistance is 4 Ω which is about two-thirds of that of a conventional device, the threshold current is about 6 mA which is about two-thirds of that of a conventional device, the optical output is 30 mW at 200 mA which is about 1.5 times of that of a conventional device. The frequency response for a small signal modulation is about 20 GHz at 3 dB bandwidth which is about 1.5 times of that of a conventional device.

As mentioned above, inter-diffusion between Ru and the p-type dopant does not occur in the semiconductor optical device structured by stacking at least the p-type semiconductor layer 3, the nondoped semiconductor layer 4, the n-type semiconductor layers 5, 6, 7 on the Ru-doped layer 2 provided on the semi-insulating InP substrate 1. Therefore, the conductivity of the bottom electrode 12 with a large area can be p-type, and the conductivity of the top electrode 13 can be n-type.

As a result, resistivity of the device can be decreased, so that high performance can be obtained.

Instead of the Ru-doped semi-insulating InP layer 2, a Ru-doped alloy semiconductor crystal layer such as a semi-insulating InAlAs layer, a semi-insulating InGaAs layer, a semi-insulating InGaAlAs layer, a semi-insulating InGaAsP layer or the like can be used, and the same effect can be obtained. By using the alloy semiconductor crystal layer, flexibility of device design increases since the refractive index or bandgap can be changed by changing the composition of the alloy semiconductor crystal. In addition, Zn diffusion can be prevented more effectively since diffusion of impurity less likely occurs in the alloy semiconductor crystal than in InP.

Fourth Embodiment

Next, a semiconductor optical modulator with InGaAsP/InGaAsP MQW layer will be described as the fourth embodiment.

Since the structure of this semiconductor optical modulator is almost the same as that of the semiconductor laser shown in FIGS. 3A–4B, the semiconductor optical modulator will be described with reference to FIGS. 3A–4B.

First, as shown in FIG. 3A, an 1 μm-thick Ru-doped InP layer 2 (Ru doping concentration is about $1 \times 10^{18}$ cm$^{-3}$) is grown on a (100) oriented Fe-doped semi-insulating InP substrate 1 by the MOVPE method. Bis($\eta^5$-2,4-dimethylpentadienyl) ruthenium(II) is used as a source material for Ru.

Next, an 1 μm-thick Zn-doped p-InP cladding layer 3, a 0.15 μm-thick nondoped InGaAsP/InGaAsP strained MQW (multiple quantum well) photoabsorption layer 4, an 1.5 μm-thick Se-doped n-InP cladding layer 5, a 0.1 μm-thick Se-doped p-InGaAsP contact layer 6 (bandgap wavelength 1.3 μm), and a 0.3 μm-thick Se-doped n-InGaAs contact layer 7 are grown in this order.

Each compound semiconductor layer except for the photoabsorption layer is lattice-matched to the InP substrate except where specifically noted.

Next, as shown in FIG. 3A, the layers which are not covered by a SiO$_2$ mask 8 are etched to about halfway through the Zn-doped p-InP cladding layer 3 by RIE (reactive ion etching), so that a mesa stripe with about 2 μm width and about 2.5 μm height is formed.

In addition, as shown in FIG. 3B, the SiO$_2$ mask 8 and one side of the mesa stripe are covered with a photo resist 9. Then, the side which is not covered by the photo resist 9 is etched to halfway through the Ru-doped InP layer 2 by RIE.

After that, the photo resist 9 is removed, and, as shown in FIG. 4A, a 3 μm-thick semi-insulating InP 10 burying layer is grown (Ru doping concentration is about $2 \times 10^{18}$ cm$^{-3}$) on both sides of the mesa stripe while doping Ru by the MOVPE method.

Then, as shown in FIG. 4B, a part of the Ru-doped semi-insulating InP burying layer 10 is removed by RIE, so that the Zn-doped InP cladding layer 3 is exposed, and a p-electrode 12 is formed on the surface. In addition, an n-electrode 13 is formed on the top of the mesa stripe.

Performance of the semiconductor optical modulator of this embodiment improves compared with a conventional device in which an n-type semiconductor crystal layer, a nondoped semiconductor crystal layer and a p-type semiconductor crystal are formed in this order on the semi-insulating substrate. The differential resistance is 4 Ω which is about two-thirds of that of a conventional device. The frequency response for a small signal modulation is about 20 GHz at 3 dB bandwidth which is about 1.5 times of that of a conventional device.

Instead of the Ru-doped semi-insulating InP layer 2, a Ru-doped alloy semiconductor crystal layer such as a semi-insulating InAlAs layer, a semi-insulating InGaAs layer, semi-insulating InGaAlAs layer, a semi-insulating InGaAsP layer or the like which are lattice-matched to InP can be used, and the same effect can be obtained. By using such alloy semiconductor crystal layer, flexibility of device design increases since the refractive index or bandgap can be changed by changing the composition of the alloy semiconductor crystal.

In addition, instead of using Zn as the p-type impurity in the p-type cladding layer, another p-type impurity (Be, Cd, Mg and the like) can be used, and the same effect can be obtained.

In addition, instead of using the Ru-doped InP crystal as the burying layer 10, materials which are lattice-matched to InP such as InGaAlAs, InAlAs and the like can be effectively used. Further, materials other than the semiconductor, such as polyimide and the like can be used as the burying layer.

In addition, although the InGaAsP/InGaAsP-MQW is used as the MQW layer in the above-mentioned embodiment, the present invention is effective for every structure of bulk layers, MQW layers and the like such as InP-InGaAsP-InGaAs structure, InAlAs-InGaAlAs-InGaAs structure and the like.

Although the semiconductor laser and the semiconductor optical modulator are described in the above-mentioned embodiments, the present invention is also effective not only for other semiconductor optical devices such as a semiconductor optical amplifier, a photodiode and the like, and a semiconductor electronic device, but also for an integrated device in which an optical modulator and a semiconductor laser are integrated, an integrated device in which a semiconductor optical amplifier and an optical modulator are integrated, and an optoelectronic integrated circuit (OEIC) in which the semiconductor optical device and the semiconductor electronic device are integrated.

As described specifically based on the embodiments, according to the present invention, since the Ru-doped semi-insulating InP layer that has a complete semi-insulating property is inserted between the Fe-doped semi-insulating InP substrate and the Zn-doped p-InP cladding layer, inter-diffusion between Fe and Zn can be prevented. As a result, conventional problems are solved. That is, the semi-insulating property of the substrate does not degrade, and the concentration of the p-type dopant in the p-type cladding layer does not decrease. Therefore, the remarkable effect that a high performance semiconductor optical device can be fabricated can be obtained. The same effect can be obtained for the semiconductor electronic device and the like.

The present invention is not limited to the specifically disclosed embodiments, and variations and modifications may be made without departing from the scope of the invention.

What is claimed is:

1. A semi-insulating substrate comprising:
   a substrate; and
   a Ru-doped semi-insulating semiconductor layer that is formed on said substrate;
   wherein said Ru-doped semi-insulating semiconductor layer has a complete semi-insulating property, and wherein:
      said substrate is a Fe-doped semi-insulating InP substrate; and
      said Ru-doped semi-insulating semiconductor layer is a Ru-doped semi-insulating InAlAs layer, or a Ru-doped semi-insulating InGaAs layer, or a Ru-doped semi-insulating InGaAlAs layer, or a Ru-doped semi-insulating InGaAsP layer.

2. A semiconductor optical device comprising at least a p-type semiconductor layer, a nondoped semiconductor layer and an n-type semiconductor layer, which are stacked in this order on a semi-insulting substrate;
   said semi-insulating substrate comprising:
      a substrate; and
      a Ru-doped semi-insulating semiconductor layer that is formed on said substrate;
      wherein said Ru-doped semi-insulating semiconductor layer has a complete semi-insulating property.

3. The semiconductor optical device of claim 2, wherein:
   said substrate is a Fe-doped semi-insulating InP substrate; and
   said Ru-doped semi-insulating semiconductor is a Ru-doped semi-insulating InP layer.

4. The semiconductor optical device of claim 2, wherein:
   said substrate is a Fe-doped semi-insulating InP substrate; and
   said Ru-doped semi-insulating semiconductor layer is a Ru-doped semi-insulating InAlAs layer, or a Ru-doped semi-insulating InGaAs layer, or a Ru-doped semi-insulating InGaAlAs layer, or a Ru-doped semi-insulating InGaAsP layer.

5. A fabrication method of semiconductor thin film, comprising:
   forming a Ru-doped semi-insulating semiconductor layer on a Fe-doped semi-insulating InP substrate, wherein said Ru-doped semi-insulating semiconductor layer has a complete semi-insulating property; and
   forming a semiconductor crystal growth layer to which a p-type impurity is doped,
   wherein said Ru-doped semi-insulating semiconductor layer is a Ru-doped semi-insulating InP layer, or a Ru-doped semi-insulating InGaAs layer, or a Ru-doped semi-insulating InGaAlAs layer, or a Ru-doped semi-insulating InGaAsP layer.

* * * * *

UNITED STATES PATENT AND TRADEMARK OFFICE
CERTIFICATE OF CORRECTION

PATENT NO.    : 6,692,837 B2
DATED         : February 17, 2004
INVENTOR(S)   : Ryuzo Iga et al.

It is certified that error appears in the above-identified patent and that said Letters Patent is hereby corrected as shown below:

Title page,
Item [75], Inventor, please change "Ryuzo Iga, Atsugi (JP); Matsuyuki Ogasawara, Isehara (JP); Susumu Kondo, Tama (JP); Yasuhiro Kondo, Atsugi (JP)" to -- Ryuzo Iga, Atsugi-shi (JP); Matsuyuki Ogasawara, Isehara-shi (JP); Susumu Kondo, Tama-shi (JP); Yasuhiro Kondo, Atsugi-shi (JP) --

Column 2,
Lines 19 and 27, change "are not obtained" to -- is not obtained --

Column 3,
Line 4, change "not be obtained" to -- not been obtained --

Column 8,
Line 64, change "times of that of" to -- times that of --

Column 9,
Line 2, change "semi-insulating" to -- a semi-insulating --

Signed and Sealed this

Twenty-sixth Day of July, 2005

JON W. DUDAS
*Director of the United States Patent and Trademark Office*